US012645753B2

(12) United States Patent
Lindt et al.

(10) Patent No.: US 12,645,753 B2
(45) Date of Patent: Jun. 2, 2026

(54) METHOD AND APPARATUS FOR PRODUCTION PROCESS OPTIMIZATION BASED ON DETERMINED CORRELATIONS BETWEEN FIRST AND SECOND MEASUREMENTS FROM PRODUCTION PROCESSES

(71) Applicant: Robert Bosch GmbH, Stuttgart (DE)

(72) Inventors: Stefan Patrick Lindt, Gerlingen (DE);
Eric Sebastian Schmidt, Heimsheim
(DE); Jonas Bergdolt,
Bietigheim-Bissingen (DE)

(73) Assignee: Robert Bosch GmbH, Stuttgart (DE)

( * ) Notice: Subject to any disclaimer, the term of this patent is extended or adjusted under 35 U.S.C. 154(b) by 385 days.

(21) Appl. No.: 18/349,150

(22) Filed: Jul. 9, 2023

(65) Prior Publication Data

US 2024/0012877 A1     Jan. 11, 2024

(30) Foreign Application Priority Data

Jul. 11, 2022    (DE) ..................... 10 2022 207 075.5

(51) Int. Cl.
*G06F 17/18*         (2006.01)
*H10P 74/00*        (2026.01)

(52) U.S. Cl.
CPC .............. *G06F 17/18* (2013.01); *H10P 74/23*
(2026.01)

(58) Field of Classification Search
CPC ................................. G06F 17/18; H01L 22/20
See application file for complete search history.

(56) References Cited

U.S. PATENT DOCUMENTS

2012/0185221 A1*    7/2012    Mori .................... H05K 13/083
                                              703/2
2014/0188265 A1*    7/2014    Bickford ................. H01L 22/14
                                              700/121
(Continued)

FOREIGN PATENT DOCUMENTS

DE           102 01 804 C1      10/2003
DE       10 2019 208 922 A1    12/2020

OTHER PUBLICATIONS

Lee et al., "A data-driven approach to selection of critical process steps in the semiconductor manufacturing process considering missing and imbalanced data," Journal of Manufacturing Systems 52 (2019), pp. 146-156.

*Primary Examiner* — John C Kuan
(74) *Attorney, Agent, or Firm* — Maginot, Moore & Beck LLP

(57)         ABSTRACT

A method is disclosed for determining correlations between first measurements and second measurements after respectively different production steps for optimizing the production steps. The method includes multiple repetition of the following steps: drawing random samples from the set of measurements and calculating a correlation matrix between the first and the second measurements contained in the randomly drawn sample. After the repetitions have been completed, a mean correlation matrix is determined over the correlation matrices and a standard variance matrix of the correlation matrices. Then follows a determination of significance values based on a division of absolute value of the mean correlation matrix element by element with the absolute values of the standard variance matrix. Depending on the significance values, one of the production steps can be adjusted.

7 Claims, 3 Drawing Sheets

(56)                    References Cited

U.S. PATENT DOCUMENTS

| | | | | |
|---|---|---|---|---|
| 2021/0342735 A1* | 11/2021 | Kartoun | ................. | G06N 20/00 |
| 2022/0067578 A1* | 3/2022 | Cmielowski | ....... | G06Q 30/0251 |
| 2022/0156578 A1* | 5/2022 | Allahdadian | ......... | G06N 3/084 |
| 2024/0004953 A1* | 1/2024 | Lackey | ................... | G06F 17/16 |

* cited by examiner

1

METHOD AND APPARATUS FOR PRODUCTION PROCESS OPTIMIZATION BASED ON DETERMINED CORRELATIONS BETWEEN FIRST AND SECOND MEASUREMENTS FROM PRODUCTION PROCESSES

This application claims priority under 35 U.S.C. § 119 to application no. DE 10 2022 207 075.5, filed on Jul. 11, 2022 in Germany, the disclosure of which is incorporated herein by reference in its entirety.

The disclosure relates to a method for determining correlations between first measurements and second measurements from different production processes and the use thereof for optimizing production processes, as well as to an apparatus and a computer program which execute the method and to a machine-readable storage medium.

BACKGROUND

Currently, an analysis of correlated process steps between semiconductor processes is mainly based on expert knowledge, since conventional methods are unreliable in case of very small, sparse and overspecified data sets. This characteristic of sparse data can be attributed to the fact that a sampling mechanism is used in monitoring the processes in order to shorten the test time and thus reduce the cycle time of the individual wafers. However, conventional machine learning approaches fail when the number of missing values is very high in combination with the very low sampling rate.

ADVANTAGES OF THE DISCLOSURE

The present disclosure enables analysis of small, sparse, and overspecified data sets to reveal dependences.

Results of the present disclosure can then be used to improve and better understand the manufacturing process in semiconductor production. This can be used to quantitatively validate existing experience as well as to uncover new dependences between, for example, inline and PCM measurements. This enables faster and more effective control and tuning of production parameters depending on the results of the dependence analysis, resulting in faster ramp-up of new products or higher yields in case of products already in production.

Further aspects of the disclosure are the subject matter set forth below. Advantageous further developments are the subject matter also disclosed below.

SUMMARY

In a first aspect, the disclosure relates to a computer-implemented method for determining correlations between first measurements and second measurements, wherein the first measurements were acquired after a first production step of an object or plurality of objects and the second measurements were acquired after a second production step of the object(s), in particular directly following the first production step. The object can be a product to be manufactured, such as, for example, a semiconductor element. The production steps can be different manufacturing processes in semiconductor production.

The method starts with providing a set of measurements, divided into first measurements and second measurements and a number of samples. This is followed by repeating the steps of drawing random samples and calculating a correlation matrix several times until a termination criterion is met. In the step of drawing random samples, the samples are drawn from the set of measurements. In the step of calculating the correlation matrix, a correlation matrix is determined between the first and second measurements contained in the randomly drawn sample.

After the replicates are completed, a mean correlation matrix is obtained over all correlation matrices obtained for the plurality of the replicates. The mean correlation matrix can be understood as a correlation matrix determined by averaging over the determined correlation matrices of the repetitions. This is followed by a determination of a standard variance matrix of the determined correlation matrices, which were determined for the plurality of the repetitions. This is followed by a determination of the significance values by way of a division by elements of absolute values of the average correlation matrix with the absolute values of the standard variance matrix. The significance values characterize a correlation of the first measurements with the second measurements. The significance values can be in the form of a matrix.

It is proposed that the first and second measurements in each case comprise a plurality of different measurements (measurement types), wherein the multiple repetition of the steps of drawing random samples and calculating a correlation matrix and the subsequent steps of determining the significance values is performed for each of the combinations of the different measurements of the first and second measurements.

It is further proposed that a significance threshold is predetermined, wherein those first measurements of the set of measurements with a significance value less than the significance threshold are removed from the set of measurements, and those second measurements whose associated first measurements have been removed are also removed. An associated measurement can be understood as that second measurement, which was performed on the same object as the first measurement. Then, an Explainable Boosting Machine (EBM) is trained on the reduced set of measurements. Then, a correlation between the first and second measurements is determined depending on a marginalization of the trained Explainable Boosting Machine. This procedure has the advantage that even more precise dependences of the first measurements on the second measurements can be found.

Furthermore, it is suggested that the first measurements are inline measurements and the second measurements are PCM measurements. The advantage here is that both existing experience can be quantitatively validated and new dependences between inline and PCM parameters can be uncovered. This allows production parameters to be controlled and adjusted more quickly and effectively, resulting in faster ramp-up of new products or higher yields in case of products already in production. This makes the method particularly suitable for the manufacture of semiconductor components.

Furthermore, it is suggested that depending on the significance values or correlation from the EBM, one of the production steps is adjusted. Preferably, depending on the significance values, i.e. correlations of the first and second measurements, or correlation from the EBM and depending on a preferably predetermined second measurement to be achieved, the first production process or/and the second production process is adapted so that on the basis of the adapted production process the second measurement to be achieved can essentially be achieved. It is conceivable that the second measurement to be obtained is a nominal measurement value or a tolerance range for the second measurement. Particularly preferably, the significance values or correlation from the EBM are used to select first measurements that correlate particularly strongly with the second measurement to be obtained. Then, depending on the selected first measurements, the first production process or/and the second production process can be adjusted accordingly, which influence the selected first measurements.

In further aspects, the disclosure relates to an apparatus and to a computer program, which are each configured to perform the aforementioned methods, and to a machine-readable storage medium on which said computer program is stored.

BRIEF DESCRIPTION OF THE DRAWINGS

Embodiments of the disclosure are explained in greater detail below with reference to the accompanying drawings. In the drawings:

FIG. 2 schematically illustrates an embodiment example for controlling a fabrication system.

DETAILED DESCRIPTION

In the production of semiconductor wafers, the wafers are tested after various production steps, wherein inline measurements, also known as inline quality controls, are performed after the completion of a first production step, and PCM measurements are performed after the completion of a second production step. If process engineers know how the PCM values depend on the inline values, they can fine-tune the manufacturing process of the individual production steps to achieve optimal results.

Inline measurements are very sparse because not every test is performed on all wafers. Thus, sampling is performed, which, among other things, can lead to missing more than 90% of the observations. Furthermore, with classical imputation methods it is possible to estimate missing measurements. Known machine learning approaches are not able to handle input vectors with empty entries. To make matters worse, especially in a start-up phase of new products, they are often overspecified and contain only a small number of observations. A small data set makes it difficult to learn a reliable model. Overspecification complicates the search for true underlying dependences, leads to overconfidence in statistics and models, and data-driven feature selection leads to p-hacking/data dredging.

Figure 1:
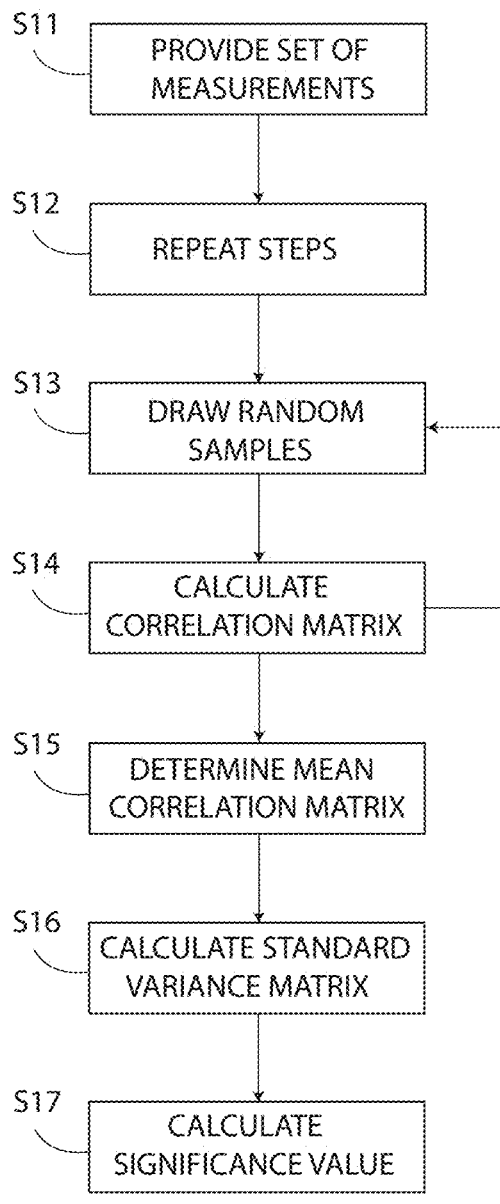
FIG. 1 schematically illustrates a flow chart of one embodiment of the disclosure.

FIG. 1 schematically shows a flowchart of a method 20 which can deal with the problem just mentioned and in particular makes it possible to identify significant correlations in smaller data sets.

The method starts with step S11. This step involves providing or obtaining a set of measurements O, divided into first measurements after a first production step and second measurements after a second production step, a number of bootstrap samples n_bootstrap, and a number of observations in each bootstrap sample as a fraction of the original sample size fraction_samples. The number of samples comprises at least 100, in particular 2500, first measurements.

In a preferred embodiment, the first and second measurements are inline and PCM measurements.

After step S11 is completed, it is followed by repeating S12 several times until a loop index i incrementally reaches the n_bootstrap values. When repeating, steps S13 and S14 are repeatedly executed one after the other. In step S13 random samples are drawn from the set of measurements O. The size of the sample drawn should be fraction_samples x len(O).

In step S14, a calculation of a correlation matrix C_i between the first—and the second measurements contained in the drawn bootstrap sample is performed.

After the repetition S12 has been completed, step S15 follows. Herein, a mean correlation matrix C_m is determined over all correlation matrices C_i from step S14 across all n_bootstrap repetitions.

This is followed in step S16 by a calculation of the standard variance matrix C_σ of the correlation matrices from step S14 over all n_bootstrap repetitions.

This is followed in step S17 by a calculation of a significance value: $|C\_m/C\_\sigma|$, wherein the division and absolute value are understood element by element.

Finally, an output for each combination of first and second measurement can be given a significance value for their correlation. That is, the significance value characterizes a correlation of these measurements.

In each iteration, the above method generates a bootstrap sample from the original data set (=set of measurements O) and computes the covariances. The size of the samples drawn represents a trade-off between bias and variance. By choosing smaller sample sizes, the bootstrap samples become more independent, i.e., they do not necessarily have the same bias as the overall data set; however, the smaller samples have a larger variance in their statistics. Preferably, the heuristic chosen is a sample size that is half the size of the data set. In principle, a larger number of samples can also mitigate the problem of variance with smaller sample sizes.

After all iterations in S12 have been performed, an estimate of the distribution of each covariance is available. Thus, statistics such as mean and standard deviation of empirical covariance distributions can be calculated.

The significance value is defined as the bootstrap mean divided by the bootstrap standard deviation of the respective correlation. Since correlation involves averaging over random variables, it can be expected that its distribution is asymptotically normally distributed according to the central limit theorem. From this it can be deduced that when a single correlation is tested for significance, there is a 95% confidence that it is not zero if the significance value is greater than or equal to two. However, if many correlations are processed at the same time (e.g. 2,500), a correction of the significance value can be made. Preferably, the correction of the significance value is done by way of a Bonferroni correction. A Bonferroni correction will have a higher significance value, for example, a significance value greater than or equal to 4 for 2,500 correlations. Since the Bonferroni correction is conservative, a low threshold equal to 3 can also be chosen for the example just given.

In another embodiment of the disclosure, the output result of the significance values of the method 20 can be used to further an analysis and attempt to model dependences.

For example, predicting PCM measurements by way of the sparse inline data is nearly impossible. In fact the inline measurements are mostly blank, suggesting that no reliable predictions can be made, but the inventors have found that something can still be learned about the relationship between inline measurements and their associated PCM measurements.

In modeling, preference is given to Explainable Boosting Machines (EBM), i.e. interpretable glass-box models that enable a deeper understanding of what influences model predictions. They compute the marginal impact of each input feature on the target, which makes them particularly suitable for our case of application. In addition, a tree-based EBM can be used, which makes it possible to deal with missing values in the input.

To model the dependences between the first and second series of measurements, the output significance values of method 20 can be used as follows.

First, there is a provision of first measurements X, second measurements y, and a significance threshold T.

This is followed by calculating the significance values of all correlations between first and second measurements according to method 20, or the significance values are provided according to method 20.

This is followed by a deletion of all first measurements from X with a significance value smaller than T.

This is followed by a deletion of second measurements whose associated first measurements have been deleted.

Subsequently, a scaling of the first measurements can take place. The scaling can be done e.g. with a min-max scaling.

Subsequently, an imputation of missing values with values outside the observation/measurement range (e.g. –0.1) can be performed.

This is followed by training an explainable boosting machine regressor with a decision tree as the base estimator. For training, one can resort to well-known methods for training EBM, e.g., see publication by authors Yin Lou, Rich Caruana, Giles Hooker, Johannes Gehrke, "Accurate Intelligible Models with Pairwi se Interactions" KDD'13, Aug. 11-14, 2013, Chicago, Illinois, USA|August 2013, Published by ACM.

Subsequently, the results can be re-scaled to the original scale of the input data.

Finally, a dependence analysis can be output. For this purpose, a marginalization can be determined over at least intervals of the measurement ranges of the first measurements using the trained EBM in order to obtain a more precise significance value, in particular dependence value. The dependence analysis can also be output based on the individual functions of the EBM, since EBM are inherently interpretable. The final predictor of the EBM can be represented as $pred=f_1(feature_1)+ \ldots +f_n(feature_n)$, wherein the implicitly learned functions $f_1, \ldots, f_n$ can be understood as a (non-linear) dependence between respective $feature_1, \ldots feature_n$, and pred.

The resulting dependences can then be used to optimize production steps and enable faster and more informed Design of Experiment (DoE) tuning of machines during the start-up phase of new production lines.

For example, if one of the second measurements is outside a specified or tolerable range, the significance values can be used to determine which first measurements correlate most strongly with that second measurement. From these first correlating measurements it can then be deduced to what extent a production process, which has an influence on the first correlating measurements, needs to be adjusted. This adaptation can be done, for example, by adapting process parameters, preferably by adapting these process parameters to a control system accordingly.

It is also conceivable that the adjustment of the process parameters is dependent on an absolute deviation of the second measurement to the specified or tolerable range and can be done depending on the significance value and optionally based on a physical domain model characterizing dependences between the production steps and measurements.

Figure 2:
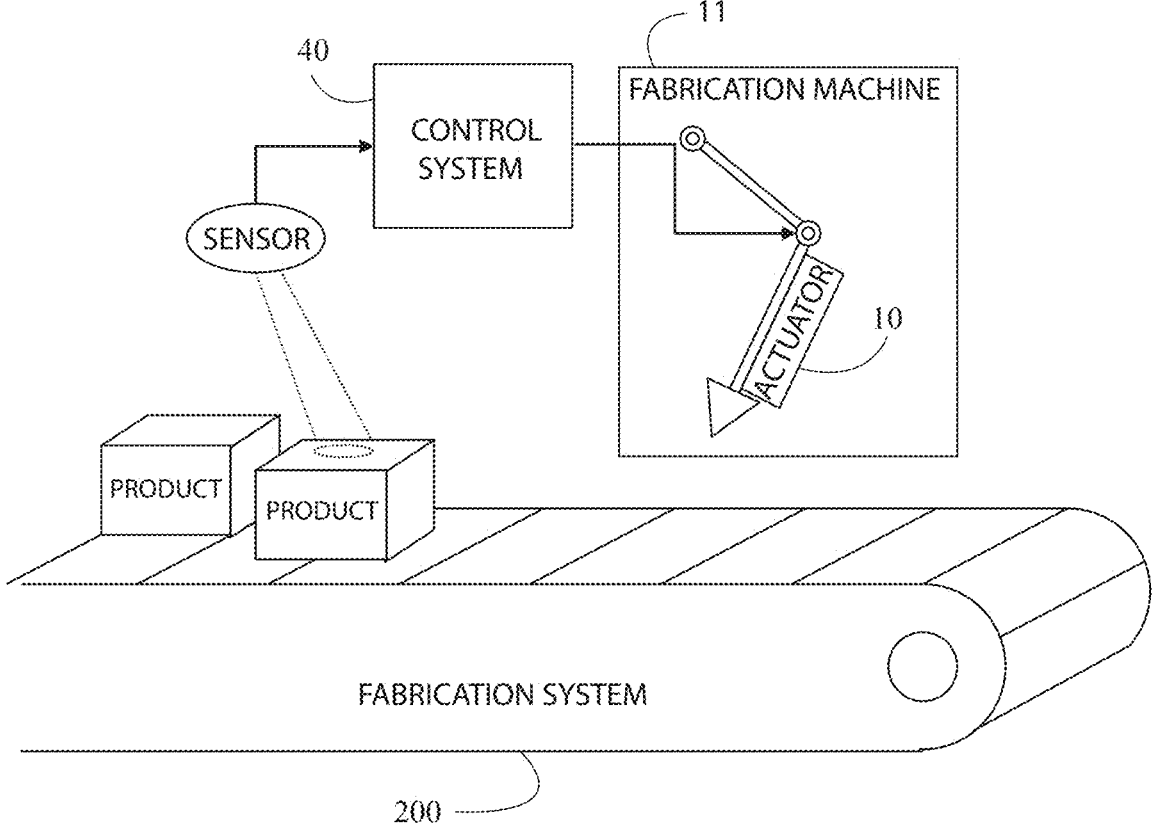
FIG. 2 schematically illustrates an embodiment example for controlling an at least semiautonomous robot.

FIG. 2 shows an embodiment in which the control system 40 with the corresponding process parameterization is used to control a fabrication machine 11 of a fabrication system 200 by controlling an actuator 10 that controls this fabrication machine 11. The fabrication machine 11 can be, for example, a machine for punching, sawing, drilling, milling, and/or cutting, or a machine that performs a step of a semiconductor production process, such as chemical deposition methods, etching and cleaning processes, physical deposition and cleaning methods, ion implantation, crystallization or temperature processes (diffusion, annealing, melting, etc.), photolithography, or chemical mechanical planarization.

Figure 3:
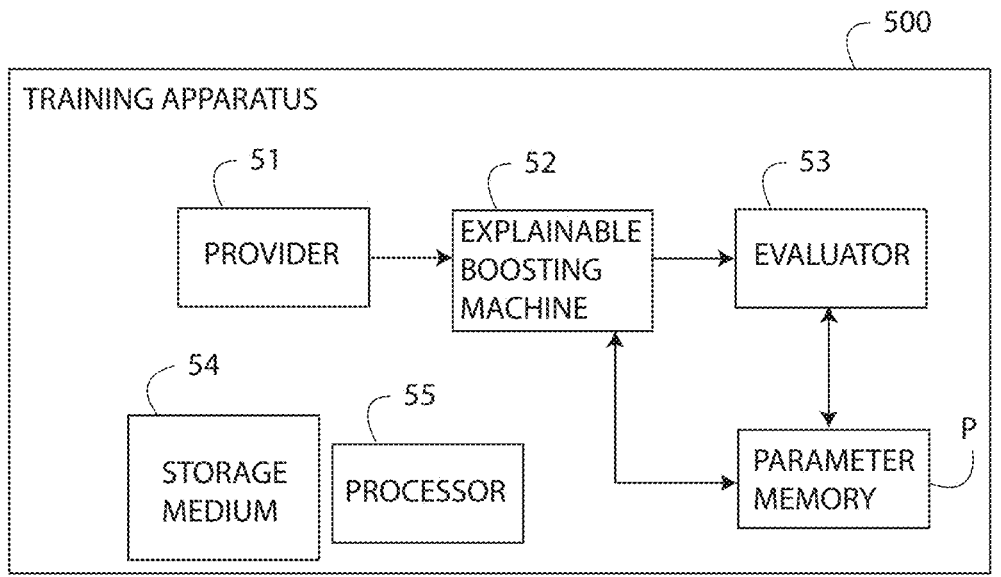
FIG. 3 schematically illustrates a training apparatus.

FIG. 3 schematically shows a training apparatus 500 which comprises a provider 51 that provides measurements of step S11 from a training data set. First measurements are fed to the EBM 52 to be trained, which determines the second measurements from them. Output variables and input images are supplied to an evaluator 53, which determines updated hyper-/parameters therefrom, which are transmitted to the parameter memory P and replace the current parameters there. The evaluator 53 is set up to perform optimization of parameters of the EBM during training.

The methods carried out by the training apparatus 500 can be implemented as a computer program, stored on a machine-readable storage medium 54, and executed by a processor 55.

The term "computer" comprises any devices for processing pre-determinable calculation rules. These calculation rules can be in the form of software, or in the form of hardware, or also in a mixed form of software and hardware.

What is claimed is:

1. A method for determining correlations between first measurements and second measurements, wherein the first measurements were acquired after a first production step and the second measurements were acquired after a second production step subsequent to the first production step, the method comprising:

providing a set of measurements divided into the first measurements and the second measurements;

multiple repetition until a loop index has incrementally reached a predetermined value, wherein the following steps are executed as multiple repeated steps during the multiple repetition (i) drawing random samples from the set of measurements, and (ii) calculating a correlation matrix between the first and second measurements contained in the randomly drawn sample;

after the repetitions are completed, determining a mean correlation matrix over a plurality of determined correlation matrices of the multiple repeated steps;

determining a variance-covariance matrix of the determined correlation matrices of the multiple repeated step;

determining significance values between the first and second measurements based on an element-wise division of absolute values of the mean correlation matrix with absolute values of the variance-covariance matrix; and depending on the correlations or the significance values of the first and second measurements and depending on a second measurement to be obtained, the first production process and/or the second production process is adjusted.

2. The method according to claim 1, wherein the first and second measurements each comprise a plurality of different measurements, wherein the multiple repetition and subsequent steps are performed to determine the significance values for each of a number of combinations of the different measurements of the first and second measurements.

3. The method according to claim 1, wherein;

a significance threshold is predetermined, a reduced set of measurements is formed by (i) removing the first measurements of the set of measurements with a significance value less than the significance threshold from the set of measurements, and (ii) removing the second measurements, whose corresponding first measurement has been removed, an Explainable Boosting Machine is trained on the reduced set of measurements, and a correlation between the first and second measurements is determined depending on a marginalization of the trained Explainable Boosting Machine.

4. The method according to claim 3, further comprising inputting missing second measurements with measured values outside a range of measured values.

5. The method according to claim 3, wherein the significance threshold is predetermined depending on a number of samples.

6. The method according to claim 1, wherein the first measurements are inline measurements and the second measurements are process control monitoring ("PCM") PCM measurements.

7. An apparatus configured to perform the method according to claim 1.

* * * * *